(12) United States Patent
Tanaka et al.

(10) Patent No.: US 7,622,199 B2
(45) Date of Patent: Nov. 24, 2009

(54) WATER-ABSORBING AGENT FOR ORGANIC EL DEVICE AND ORGANIC EL DEVICE

(75) Inventors: Satoshi Tanaka, Mobara (JP); Shigeru Hieda, Mobara (JP); Hisamitsu Takahashi, Mobara (JP); Yoshihisa Tsuruoka, Mobara (JP)

(73) Assignee: Futaba Corporation (JP)

( * ) Notice: Subject to any disclaimer, the term of this patent is extended or adjusted under 35 U.S.C. 154(b) by 459 days.

(21) Appl. No.: 11/100,936

(22) Filed: Apr. 7, 2005

(65) Prior Publication Data

US 2005/0227114 A1 Oct. 13, 2005

(51) Int. Cl.
*H01L 51/54* (2006.01)
*C09K 3/00* (2006.01)

(52) U.S. Cl. .......... 428/690; 428/76; 428/917; 252/194; 313/504; 313/506; 313/512; 257/100

(58) Field of Classification Search .......... 252/194; 313/504, 506, 512; 257/100
See application file for complete search history.

(56) References Cited

U.S. PATENT DOCUMENTS

| | | | | |
|---|---|---|---|---|
| 6,226,890 | B1 * | 5/2001 | Boroson et al. | 34/472 |
| 6,878,467 | B2 * | 4/2005 | Chung et al. | 428/690 |
| 6,987,354 | B2 * | 1/2006 | Arakawa et al. | 313/506 |
| 2002/0015818 | A1 * | 2/2002 | Takahashi et al. | 428/76 |
| 2003/0170496 | A1 * | 9/2003 | Hieda et al. | 428/690 |
| 2004/0061439 | A1 * | 4/2004 | Cok | 313/512 |

FOREIGN PATENT DOCUMENTS

JP 2002231443 8/2002

OTHER PUBLICATIONS

Abstract of Pat. No. JP2002231443 dated Aug. 16, 2002.
Patent Abstract of Japan 2002-033187, published Jan. 31, 2002.
Patent Abstract of Japan 2002-083688, published Mar. 22, 2002.
Patent Abstract of Japan 2003-347043, published Dec. 5, 2003.
Patent Abstract of Japan 2004-079209, published Mar. 11, 2004.
Patent Abstract of Japan 2004-103514, published Apr. 2, 2004.

* cited by examiner

*Primary Examiner*—Dawn Garrett
(74) *Attorney, Agent, or Firm*—Quarles & Brady, LLP

(57) ABSTRACT

A thin-profile organic EL device with a high degree of reliability is provided. The anode, the organic layer and the light transmissible-type cathode are laminated on the substrate and the inorganic water-barrier layer are laminated thereon, and then a UV rays-curable type water-capturing agent comprising a UV rays-curing agent and a water-absorbing agent is cured to bond to the sealing substrate instead of an adhesive layer. The UV rays-curing agent comprises an acrylic monomer, initiator and accelerator. The UV rays-curable type sealing agent is placed to the outer peripheral portion of the UV rays-curable type water-capturing agent to be cured. The emission of the organic layer is transmitted upward via the cathode, UV rays-curable type water-capturing agent and the sealing substrate. The UV rays-curable type water-capturing agent can be formed in a desired thickness and pattern by applying it and irradiating with UV-rays, thereby making it possible to produce a low-profile organic EL device in large quantities with a high degree of reliability and without damaging the organic layer which is not resistant to water.

17 Claims, 2 Drawing Sheets

WATER-ABSORBING AGENT FOR ORGANIC EL DEVICE AND ORGANIC EL DEVICE

CROSS REFERENCES TO RELATED APPLICATIONS

This application claims the priority benefit of Japanese Patent Application No. 2004-114343 filed on Apr. 8, 2004.

STATEMENT REGARDING FEDERALLY SPONSORED RESEARCH

Not Applicable.

BACKGROUND OF THE INVENTION

The present invention generally relates to a water-absorbing agent and an organic EL device using the same. More particularly, the present invention relates to an improved technology making it possible to produce in large quantity a low-profile organic EL device with a high degree of reliability which is not affected by water or oxygen and maintains stable light emitting characteristics for a long time.

Generally, an organic EL device is a self-light emitting device having a light-emitting part of a laminate comprising an organic EL layer formed of a thin film containing a luminescent organic compound sandwiched between an anode and a cathode. A hole and an electron are injected into the thin film containing a luminescent organic compound and are re-combined to generate an exciton. When the exciton is deactivated, it emits fluorescence or phosphorescence.

Since the light-emitting part of the organic EL device is not resistant to water, the light-emitting part is hermetically sealed in a sealed enclosure of glass or metal so as not to be exposed to the air. Concretely, the light-emitting part is formed as a laminate on a glass substrate, covered with a sealing cap of glass or metal from the light-emitting part and laminated to be sealed, and is sealed in a sealed enclosure formed of the substrate and the sealing cap. A water-capturing agent, such as barium oxide (BaO), calcium oxide (CaO), and the like, is charged in the sealed enclosure for capturing water. As a result, water attached to the light-emitting part and water present in an atmosphere inside the sealed enclosure, as well as, water which permeates from the outside of the sealed enclosure to the inside of the sealed enclosure through a sealing faces can be captured.

Figure 1:
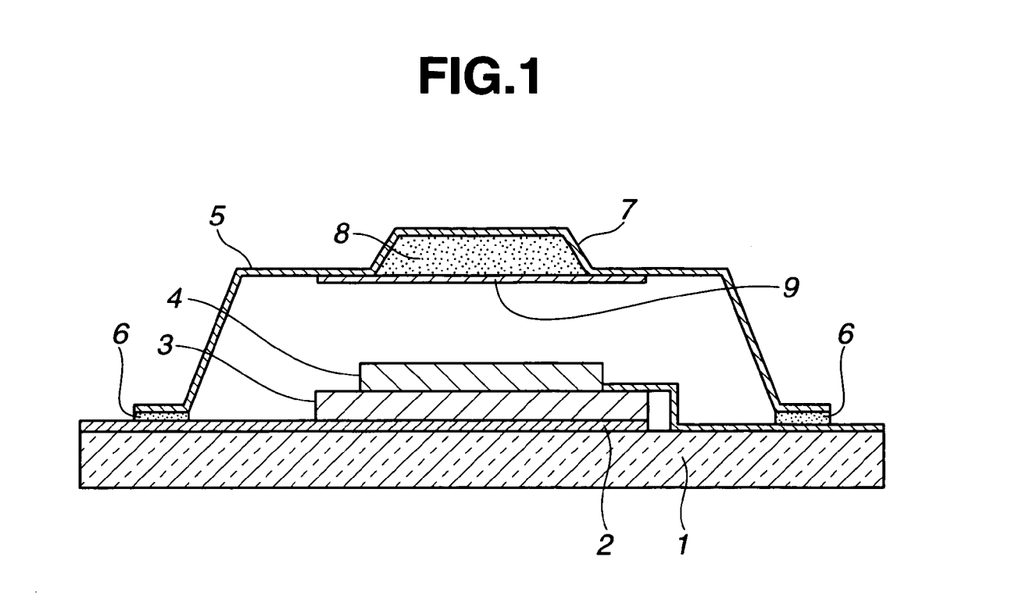
FIG. 1 is a cross section showing an example of the structure of an organic EL device.

FIG. 1 is a cross section showing an example of the structure of an organic EL device. As shown in FIG. 1, the anode 2 of a transparent conductive film of ITO, the organic layer 3 and the cathode 4 are laminated on the glass substrate 1 to form a light-emitting part, which is covered with the sealing cap 5 formed of metal, and the sealing cap 5 is bonded to the substrate 1 with the adhesive 6 to form a sealed enclosure. The anode 2 and the cathode 4 are adapted to penetrate hermetically through the sealing portion of the sealed enclosure to be lead outside and to drive the light-emitting part. The concave portion 7 is formed in the sealing cap 5. Powder BaO is charged in the concave portion 7 as a water-capturing agent 8 and covered with the water-permeable film 9. In this example, light-emission of the organic layer 3 transmits toward the lower position in FIG. 1 via the anode 2 and the glass substrate 1.

Figure 2:
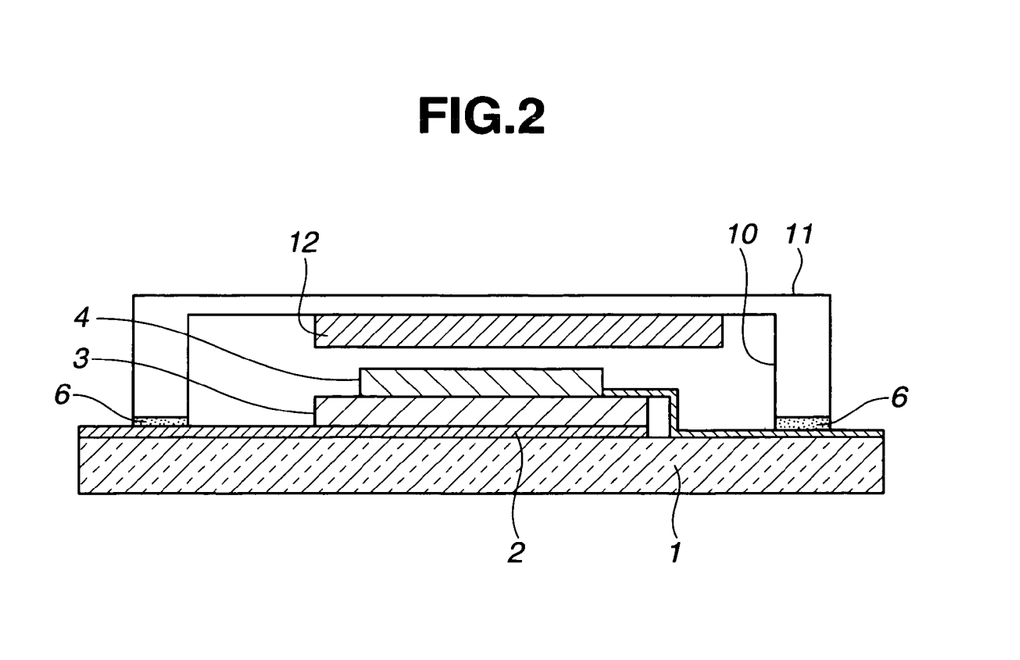
FIG. 2 is a cross section showing another example of the structure of an organic EL device.

FIG. 2 is a cross section showing the another example of the structure of an organic EL device. In the example shown in FIG. 2, a sealing glass substrate 11 is used for the sealed cap 5 of metal used in the example shown in FIG. 1. A concave portion 10 is formed on one side of the sealing substrate 11 opposite the light-emitting part by a countersinking processing, such as sandblasting, etching, and the like. The water-capturing agent 12 formed by packing CaO powder with a water-permeable agent or a seat-like water-capturing agent is affixed on the inner surface of the concave portion 10 of the sealing glass substrate 11. Further, a smaller concave portion may be optionally formed in the concave portion 10, in which the water-capturing agent is placed. The remaining structures are the same as those shown in FIG. 1. In this example, light-emission of the organic layer 3 transmits toward the lower position in FIG. 2 via the anode 2 and the substrate 1.

Figure 3:
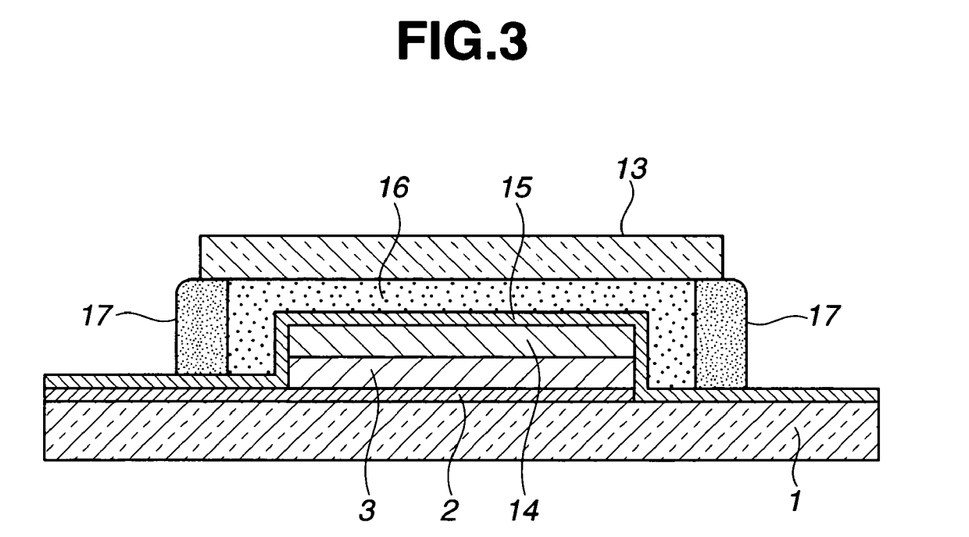
FIG. 3 is a cross section showing still another example of the structure of an organic EL device.

FIG. 3 is a cross section showing a top-emission type organic EL device, in which a sealing plate-like glass substrate 13 is used instead of the sealing cap of metal 5 shown in FIG. 1 or the sealing glass substrate 11 shown in FIG. 2. The anode 2, the organic layer 3 and the light permeable cathode 14 are laminated on the glass substrate 1 to form a light-emitting part. Further, the inorganic water-barrier layer 15 is laminated on the light-emitting part. Further, the sealing plate-like glass substrate 13 is bonded to the inorganic water-barrier layer 15 via the adhesive layer 16. In this manner, a complete solid hermitical structure without space is formed between the substrate 1 and the sealing glass substrate 13. The UV rays-curable sealing agent 17, such as epoxy sealing agent, is placed on the peripheral portion of the adhesive layer 16 to be cured and seals the cured adhesive layer 16 between the substrate 1 and the sealing glass substrate 13. In this example, light-emission of the organic layer 3 transmits toward the upper position in FIG. 3 via the cathode 14, the adhesive layer 16 and the sealed substrate 13. The top-emission type organic EL device is disclosed in Japanese Laying-open Patent Publication No. 2002-231443.

In the organic EL device shown in FIGS. 1 and 2, the concave portion 7 is formed in the sealed cap 5 which seals the light-emitting part on the substrate 1 by a pressing, or the concave portion 10 is formed in the sealing glass substrate 11 by a countersinking process, and then the powder BaO or CaO, as a water-capturing agent, or the seat-like water-capturing agent using the same is placed in the concave portion 7 or 10. When the necessary amount of the powder-like water-capturing agent is charged in the concave portion 7 or 10, its thickness is about 0.2 mm at the minimum. Accordingly, the depth of the concave portion 7 or 10 must be 0.3~0.5 mm. This creates such a problem that the thickness of the sealing substrate 11 or sealing cap 5 becomes large and the entire thickness of the organic EL device becomes large.

In the organic EL device using the metal sealing cap 5 in which the concave portion 7 is formed by such molding or the organic EL device using the sealing glass substrate 11 in which the concave portion 10 is formed by a countersinking process, and the size of the whole device is large, there has been problems that the strength of the device as a whole lowers, because the sealed enclosure is of hollow structure, and the sealed cap 5 or sealed substrate 11 is easy to be flexible and contact to the cathode 4 and the reliability as a light-emission device lowers.

In order to package a powder-like BaO or CaO as a water-capturing agent in a sealed enclosure, it is required to suppress surely the scattering of the powder. Therefore, there has been a problem that automation of assembly is hard.

In the organic EL device shown in FIG. 3, a TFT circuit for driving is formed on the surface of the device substrate 1 on the side of the anode 2, on which is formed a light-emitting part as a laminate. Therefore, the light-emission of the organic layer 3 of the light-emitting part can not be taken out of the anode 2 and is taken out of the cathode 14 via the sealing substrate 13 as described above. Since the powder-like BaO or CaO, as a water-capturing agent, or seat-like water-capturing agent using the same is not transparent, such a water-capturing agent can not be placed on the cathode 14 out of which is taken light-emission. Therefore, such an organic EL device has no water-capturing agent therein. Thus, the remaining water in the device or water permeating from the outside can not be captured, which makes it difficult to ensure the reliability.

The light-emitting part is protected from water by laminating the inorganic water-barrier layer 15 thereon. However, a very high cost is required for mounting the inorganic water-barrier layer 15. Moreover, the inorganic water-barrier layer 15 is in danger of forming a pinhole. Therefore, depending on only the inorganic water-barrier layer 15 as water-capturing measures is not suitable for measures to ensure the reliability for mass-production.

SUMMARY OF THE INVENTION

The present invention has been made in order to solve such problems as above described. An object of the present invention is to provide an improved technology making it possible to produce in large quantity a low-profile organic EL device with a high degree of reliability which is not affected by water or oxygen and maintains stable light emitting characteristics for a long time.

The water-absorbing agent for an organic EL device according to the present invention comprises an ultraviolet curing agent and a water-absorbing substance.

The water-absorbing substance in the water-absorbing agent for an organic EL device of the present invention comprises an organometallic compound selected from one of the following compounds having the chemical structural formula (1)-(5).

(1)

(Wherein R is an alkyl group, aryl group, cycloalkyl group, heterocyclic group or acyl group having one or more carbon atoms. M is a metallic atom of trivalent, n is an integer of 1 and above.)

(2)

(Wherein $R_1$, $R_2$, $R_3$, $R_4$ and $R_5$ are alkyl group, aryl group, cycloalkyl group, heterocyclic group or acyl group having one or more carbon atoms, which may be same or different each other. M is a metallic atom of trivalent.)

(3)

(Wherein $R_1$, $R_2$, $R_3$ and $R_4$ are alkyl group, aryl group, cycloalkyl group, heterocyclic group or acyl group having one or more carbon atoms, which may be same or different each other. M is a metallic atom of trivalent.)

(4)

(Wherein $R_1$, $R_2$, $R_3$, $R_4$, $R_5$ and $R_6$ are alkyl group, aryl group, cycloalkyl group, heterocyclic group or acyl group having one or more carbon atoms, which may be same or different each other. M is a metallic atom of trivalent.)

(5)

The ultraviolet curing agent in the water-absorbing agent for an organic EL device of this invention comprises a light-transmissible monomer having a lipophilic group. According to an embodiment of the present invention, the monomer is an acrylate and/or methacrylate. More specifically, the monomer may be a monofunctional acrylate represented by the chemi- cal structural formula (6) and/or a monofunctional methacrylate represented by the chemical structural formula (7);

(6)

(7)

(Wherein R is an alkyl group, aryl group, cycloalkyl group, heterocyclic group or acyl group having one or more carbon atoms.)

Alternatively, the liphophilic group may be a saturated hydrocarbon group having two and more carbon atoms in R. In this instance, the monomer is a substance represented by the chemical structural formula (8) and/or substance represented by the chemical structural formula (9).

(8)

(9)

According to another embodiment of the present invention, the monomer is a bifunctional acrylate and/or bifunctional methacrylate. In this instance, the liphophilic group is a saturated hydrocarbon group having two and above of carbon atoms, and the monomer may be a substance represented by the chemical structural formula (10) and/or substance represented by the chemical structural formula (11).

(10)

(11)

According to another embodiment of the present invention, the monomer is a polyfunctional acrylate exceeding trifunctional acrylate and/or polyfunctional methacrylate exceeding trifunctional methacrylate. In this instance, the liphophilic group is a saturated hydrocarbon group having two and above of carbon atoms, and the monomer is a substance represented by the chemical structural formula (12) and/or substance illustrated by the chemical structural formula (13).

(12)

(13)

The organic EL device according to the present invention comprises a light-emitting part having a cathode, an organic layer and an anode placed between a first substrate and a second substrate, at least one of the substrates being light-transmissible, which takes light of the organic layer out of at least one of the anode and the cathode, wherein the water-absorbing agent for an organic EL device is placed between the first substrate and the second substrate.

The light-emitting part is formed as a laminate on the inner surface of the first substrate and the water-absorbing agent for an organic EL device is charged into the space between the inner surface of the first substrate and the light-emitting part and the inner surface of the second substrate. The organic EL device may be provided with the water barrier film placed between the light-emitting part and the water-absorbing agent for an organic EL device. The water barrier film comprises a substance selected from the group consisting of SiOx (wherein x is $0<x\leqq2$), SiN and mixture thereof. The ultraviolet-curable sealing agent is applied to the outer peripheral portion of the water-absorbing agent for an organic EL device and at least one of the outer peripheral portions of the first substrate and the second substrate and cured. The light-emitting part is formed as a laminate on the inner surface of the first substrate, a concavity is formed in the inner surface of the second substrate and the water-absorbing agent for an organic EL device is placed in the concavity to be fixed.

Since the water-absorbing agent for an organic EL device of the present invention comprises an ultraviolet curing agent and a water-absorbing substance, a water-capturing layer having desired thickness and pattern can be formed easily only by applying it to the prescribed place or part in the device and irradiating it with ultraviolet rays. According to the present invention, a large quantity of low-profile organic EL devices with a high degree of reliability, which are not affected by water or oxygen, and maintains stable light emitting characteristics for a long time can be provided.

According to the present invention, it is not necessary to form a concave portion in a sealed cap for placing a powder-like BaO or CaO or seat-like water-capturing agent using the same by molding or countersinking process, and a structure can be formed in which a light-emitting part is put between a plate-like sealed cap and a substrate on the side of an anode. Therefore, the whole thickness of the organic EL device can be made thinner, thereby making it possible to comply with a large-size with no problem. Further, according to the present invention, in the case where a concave portion in which is placed a water-capturing agent is formed in a sealed cap by molding or countersinking process, the depth of the concave portion can be made smaller. Accordingly, the whole thickness of the organic EL device can be made thinner.

According to the top-emission method of prior art, a water-capturing agent can not be placed on a cathode. According to the present invention, however, a water-absorbing agent for an organic EL device can be placed on a cathode which makes it possible to make an inorganic water-barrier layer thinner, and a manufacturing throughput can be improved and costs can be reduced.

The water-absorbing agent of the present invention can be applied to all types of organic EL devices. Accordingly, it is not necessary for EL device manufacturer to change the water-capturing agent for each different type of organic EL devices. Particularly, in the organic EL device shown in FIG. 2 having a sealed cap in which is formed a concave portion by a countersinking process, a process for packaging the water-absorbing agent for an organic EL device in the concave portion requires a coating and a UV rays-irradiation and is very easy.

BRIEF DESCRIPTION OF THE DRAWINGS

This and other objects, features, and advantages of the present invention will become more apparent upon reading of the following detailed description and drawings, in which.

DESCRIPTION OF THE EMBODIMENTS

A preferred embodiment for carrying out the present invention which the present inventors consider to be the best at the time of the invention is made will be described below.

The water-absorbing agent for an organic EL device of the present invention is a mixture of a UV rays-curing agent and a water-absorbing agent. The water-absorbing agent for an organic EL device of the present invention is a polyfunctional constituent material which functions as a sealing material for sealing a light-emitting part in a sealed enclosure of an organic EL device or as an adhesive material for assembling and fixing components such as a substrate for constituting a sealed enclosure, as well as, a water-absorbing agent for absorbing water which permeates into the sealed enclosure or water present in the light-emitting part. Accordingly, it is preferable that the UV rays-curing agent and water-absorbing agent have sufficient functions suitable for each application as described below and have properties that they are compatible with each other and can be mixed homogeneously.

1. UV Rays-curing Agent

The above UV rays-curing agent comprises a light transmissible monomer and a sensitizer (photopolymerization initiator or photopolymerization initiator and photoreaction accelerator). As a light transmissible monomer, acrylate or methacrylate having good compatibility with the water-absorbing agent of the present invention such as polyfunctional exceeding monofunctional acrylate (acrylic ester) or polyfunctional exceeding monofunctional methacrylate (methacrylic ester) represented by the chemical structural formulae (6)~(13) may be used. Acrylate and methacrylate can be used singly or as a mixture thereof.

These UV rays-curing agents are described concretely below.

(1) Acrylate as Monomer

A basic skeleton of an acrylate monomer for photopolymerization is described below.

1) Monofunctional Acrylate

A monofunctional acrylate is that represented by the chemical structural formula (6). By changing R in the chemical structural formula (6), properties such as viscosity, specific gravity, refractive index, P.I.I. value change. Also, the compatibility with a water-capturing agent changes with R. For example, in the water-capturing agent represented by the chemical structural formula (5), a plurality of hydrocarbon groups having C and H exists at outer positions and a saturated aliphatic molecule controls the compatibility of the water-capturing agent. Therefore, a good solvent having good compatibility with the water-capturing agent is a hydrocarbon solvent such as hexane, decane, or an aromatic solvent such as toluene and xylene. On the other hand, a poor solvent having poor compatibility is a water soluble solvent such as acetone and ethanol. Therefore, it is preferable that the above R contains two or more saturated hydrocarbon groups such as a methylene group in order that acrylate monomer is a good solvent for the water-capturing agent.

Specifically, the substance represented by the chemical structural formula (8) has two methylene groups, and when the distance between the two methylene groups is long, the water-capturing agent is easy to dissolve.

2) Bifunctional Acrylate

The case of bifunctional acrylate is substantially the same as that of monofunctional acrylate. A concrete example is a substance represented by the chemical structural formula (10). Since the substance represented by the chemical structural formula (10) contains oxygen atoms, its compatibility with a water-capturing agent is slightly poor compared with a substance containing methylene groups, but can be used.

3) Trifunctional Acrylate

The case of polyfunctional acrylate is the same as those of monofunctional and bifunctional acrylate. A trifunctional acrylate having methylene groups is shown by the aforementioned chemical structural formula (12).

(2) Methacrylate as Monomer

The case of a methacrylate monomer for photopolymerization as a component of a water-absorbing agent is also the same as that of the acrylate monomer for photopolymerization. Its basic skeleton is described below.

The chemical structural formula (7) is a general chemical structural formula showing monofunctional methacrylate. The chemical structural formula (9) is a general chemical structural formula showing monofunctional methacrylate having, as a liphophilic group, a methylene group which is a hydrocarbon group having two or more carbon atoms. The chemical structural formula (11) shows bisfunctional methacrylate having, as a liphophilic group, a methylene group which is a hydrocarbon group having two or more carbon atoms. The chemical structural formula (12) shows trifunctional methacrylate having, as a liphophilic group, a methylene group which is a hydrocarbon group having two or more carbon atoms.

(3) Sensitizer

A sensitizer includes a photopolymerization initiator and a photopolymerization accelerator. While it is preferable that a photopolymerization initiator is clear, colorless and transparent, there is no problem if it is not. This is because the amount of a photopolymerization initiator to be added to a curing agent is only 1~3 wt % and a cured film formed by irradiation with UV-rays is transparent even if it is colored. Further, it is necessary to select a photopolymerization initiator which does not adversely affect an organic EL device. A photopolymerization initiator is divided into two types depending on reaction mechanism; type 1), type 2).

Type 1) Molecular-cleavage Type
Benzoin.alkyl.ether,
Benzildimethylketal,
1-hydroxycyclohexylphenyl.ketone,
2-hydroxy-2-methyl-1-phenyl-propane-1-on,
Diethoxyacetophenone,
Trichloroacetophenone,
2-methyl-1-[4-(methylthio)phenyl]-2-morpholino-propane-1-on,
Dibenzosuberone,
2-hydroxy-2-methyl-1-phenyl-propane-1-on,
Diethoxyacetophenone,
Type 2) Hydrogen-Drawing Type (Photopolymerization Initiator+Photopolymerization Accelerator)
Benzophenone+bisdiethylaminobenzophenone,
2,4-diethylthioxanthone+paradimethylaminobenzoic ester,
Benzil (draws a hydrogen atom from coexisting hydrocarbon)
2-alkylanthraquinone (draws a hydrogen atom from coexisting hydrocarbon)
2-chloroanthraquinone (draws a hydrogen atom from coexisting hydrocarbon)
2,4-diethylthioxanthone which is used with aliphatic amine such as triethanoleaminie, 2. Water-absorbing Agent As the water-absorbing agent may be used an organometallic compound represented by the chemical structural formulae (1)~(5).

3. Example of an Organic EL Device

The water-absorbing agent for an organic EL device of this example can be obtained by mixing the UV rays-curing agent and water-absorbing substance and agitating. The structure of an organic EL device to which the water-absorbing agent for an organic EL device can be applied as an adhesive and water-capturing agent for assembly of a sealed enclosure is described below.

The water-absorbing agent for an organic EL device can be applied as an adhesive and water-capturing agent to an organic EL device of all type of structures which has been conventionally known. For example, in an organic EL device described with reference to FIG. 1, when the water-absorbing agent for an organic EL device is used as the water-capturing agent 8, the water-permeable film 9 is not required. Since the remaining structures are substantially the same as the structures described with reference to FIG. 1, the detailed description thereof will be omitted.

In this structure, a water-capturing layer can be easily formed by a simple work in which the water-absorbing agent for an organic EL device is applied to the concave portion 7 of the metal cap 5 and irradiated with UV-rays. Also, in this structure, the light-emission of the organic layer 3 can be observed through the glass substrate 1 from the side of the anode 2, and the light transmittancy is not necessarily required for the water-absorbing layer of the water-absorbing agent for an organic EL device of this example.

Further, in an organic EL device explained with reference to FIG. 2, the water-absorbing agent for an organic EL device of this example can be used as the water-capturing agent 12. Since the remaining structures are substantially the same as the structures described with reference to FIG. 2, the detailed explanation thereof will be omitted. In this structure, a water-capturing layer can be easily formed by a simple work in which a water-absorbing agent for an organic EL device is applied to the concave portion 10 of the sealed cap 11 of the glass-made cap and irradiated with UV-rays.

Also, in this structure, the light-emission of the organic layer 3 can be observed through the glass substrate 1 from the side of the anode 2, and the light transmittancy is not necessarily required for the water-absorbing layer of the water-absorbing agent for an organic EL device of this example.

Further, in an organic EL device explained with reference to FIG. 3, the inorganic water-barrier layer 15 and the adhesive layer 16 can be replaced by the water-absorbing agent for an organic EL device of this example. Since the remaining structures are substantially the same as the structures described with reference to FIG. 3, the detailed explanation thereof will be omitted.

In this structure, the glass substrate 1 on which the light-emitting part of the organic EL device is formed as a laminate is coated with a proper amount of a water-absorbing agent for an organic EL device so as to cover the light-emitting part, on which the sealing substrate 13 of the glass cap is put so that the water-absorbing agent for an organic EL device covers the substrate 1 and a space is not formed between the substrate 1 and the sealing substrate 13. Thereafter, the water-absorbing agent for an organic EL is irradiated with UV-rays to be cured. As a result, the light-emitting part is sandwiched between the substrate 1 and the sealing substrate 13 and they are integrated, and the light-emitting part is hermetically sealed. When the UV rays-curable epoxy sealing agent 17 is placed to the outer peripheral portions of the sealing substrate 13 and cured water-absorbing agent for an organic EL and cured, the sealing state of the light-emitting part is improved. Advantageously, curing of the water-absorbing agent for an organic EL and UV rays-curable sealing agent 17 can be carried out in a single process at the same time.

In this structure, the light-emission of the organic layer 3 is observed through the sealing substrate 13 from the side of the cathode 14, and therefore the light transmittancy is required for the water-absorbing layer of the water-absorbing agent for an organic EL device of this example. Also, in this structure, a structure can be adopted in which the inorganic water-barrier layer 15 is laminated on the light-emitting part and a layer of the water-absorbing agent for an organic EL device is placed thereon.

Next, the water-absorbing agent for an organic EL device of this invention (UV rays-curable water-capturing agent) and an organic EL device using the same will be described more in detail with reference to Examples.

EXAMPLE 1

(1) Preparation of the Water-absorbing Agent for an Organic EL Device (UV Rays-curable Water-capturing Agent)

"NK ester" (registered trade mark) manufactured by SHIN-NAKAMURA CHEMICAL INDUSTRIAL CO., LTD. as acrylic monomer, "Irgacure 907" (registered trade mark) manufactured by CIBA-GEIGY as an initiator and triethanolamine as an accelerator were mixed in the ratio of "Irgacure 907" to triethanolamine and to "NK ester" of 1:1:98 to form UV rays-curing agent. The same amount of the water-absorbing agent represented by the chemical structural formula (1) was added in the proportion by weight to the UV rays-curing agent, agitated and dissolved to form UV rays-curable water-capturing agent. The UV rays-curable water-capturing agent thus obtained was colorless transparent.

(2) Mounting to a Light-emitting Part

This example is relating to an organic EL device having the structure of the embodiment described with reference to FIG. 3.

ITO was formed in a desired pattern on a surface of the glass substrate (thickness: 0.7 mm) and placed in a vacuumed chamber. Then, a hole-injection layer, a transportation layer, an emission layer, an electron injection layer, and a cathode of Al, etc. were laminated in that order on the surface of the glass substrate by a vacuum deposition method to form a light-emitting part of the organic EL device. The interior of a glove box was replaced by nitrogen gas to a dew point of −60° C., into which was moved the substrate without exposing to the air, and UV rays-curable water-capturing agent of this example was applied on the cathode in a pattern of stripe at intervals of 5 mm by means of a dispenser. The glass substrate (thickness: 0.55 mm) was previously cleaned and dewatered by heating at 150° C. Then, the glass substrate thus treated was placed into the glove box to put on the substrate and pressure was applied to extend the UV rays-curable water-capturing agent over the whole surface of the cathode. Thereafter, a UV rays-curable sealing agent was applied between the outer peripheral portion of the sealing substrate and the substrate and irradiated with UV-rays having the dominant wavelength of 365 nm (100 mW/cm$^2$, 60 sec) to complete sealing. The thickness of the organic El device thus obtained was measured by a slide caliper and determined to be 1.27~1.30 mm.

(3) Shell Life Characteristics of the Device

The device thus formed was placed in the environment of high temperature and high humidity of 85° C. and 85% to carry out an accelerated shell life test. After an elapse of 100 hours, the device was taken out and the state of the light emission of the device was observed. As a result, it was confirmed that the state of emission after an elapse of 100 hrs was almost the same as that before the test and the occurrence and growth of non-light emitting portions were suppressed and the UV rays-curable water-capturing agent of this example sufficiently functioned.

EXAMPLE 2

(1) Preparation of the Water-absorbing Agent for an Organic EL Device (UV Rays-curable Water-capturing Agent)

Same as that of Example 1

(2) Mounting to a Light-emitting Part

This example is relating to an organic EL device having the structure of the embodiment described with reference to FIG. 3.

ITO was formed in a desired pattern on a surface of the glass substrate (thickness: 0.7 mm) and placed in a vacuumed chamber. Then, a hole-injection layer, a transportation layer, an emission layer and an electron injection layer were laminated in that order on the surface of the glass substrate by a vacuum deposition method and then an Al layer (thickness: 3 nm) and an ITO layer (thickness: 30 nm) were laminated thereon to form a transparent cathode. The emission of the substrate of the organic EL device thus formed can be taken out of both the anode and cathode. The interior of a glove box was replaced by nitrogen gas to a dew point of −60° C., into which was moved the device substrate without exposing to the air, and UV rays-curable water-capturing agent of this example was applied on the cathode in a pattern of stripe at intervals of 5 mm by means of a dispenser. The sealing glass substrate (thickness: 0.55 mm) was previously cleaned and dewatered by heating at 150° C. Then, the sealing glass substrate thus treated was placed into the glove box to put on the substrate and pressure was applied to extend the UV rays-curable water-capturing agent over the whole surface of the cathode. Thereafter, a UV rays-curable sealing agent was applied between the outer peripheral portion of the sealing substrate and the substrate and irradiated with UV-rays having the dominant wavelength of 365 nm (100 mW/cm$^2$, 60 sec) to complete sealing. The thickness of the organic EL device thus obtained was measured by a slide caliper and determined to be 1.27~1.30 mm.

In the organic EL device of this example, the emission can be taken out of both substrates of the anode and cathode, and no harmful decrease in transmittancy by UV rays-curable water-capturing agent of this example was observed.

(3) Shell Life Characteristics of the Device

The device thus formed was placed in the environment of high temperature and high humidity of 85° C. and 85% to carry out an accelerated shell life test. After an elapse of 100 hours, the device was taken out and the state of the light emission of the device was observed. As a result, it was confirmed that the state of emission after an elapse of 100 hrs was almost the same as that before the test and the occurrence and growth of non-light emitting portions were suppressed and the UV RAYS-curable water-capturing agent of this example sufficiently functioned.

EXAMPLE 3

(1) Preparation of the Water-absorbing Agent for an Organic EL Device (UV Rays-curable Water-capturing Agent)

Same as that of Example 1

(2) Mounting to a Light-emitting Part

This example is relating to an organic EL device having the structure of the embodiment described with reference to FIG. 2.

ITO was formed in a desired pattern on a surface of the glass substrate (thickness: 0.7 mm) and placed in a vacuumed chamber. Then, a hole-injection layer, a transportation layer, an emission layer, an electron injection layer, and a cathode of Al, etc. were laminated in that order on the surface of the glass substrate by a vacuum deposition method to form a light-emitting part of the organic EL device. The interior of a glove box was replaced by nitrogen gas to a dew point of −60° C., into which was moved the device substrate without exposing to the air. The glass substrate (thickness: 0.7 mm) having a concave portion formed by a countersinking process (depth of countersunk portion: 0.2 mm) was previously washed and cleaned and dewatered by heating at 150° C. Then, the glass substrate thus treated was placed into the glove box, the UV rays-curable water-capturing agent was applied in the thickness of 8 μL/cm$^2$ inside the concave portion, and was irradiated with UV-rays having the dominant wavelength of 365 nm (100 mW/cm$^2$, 60 sec) to cure and fix. Thereafter, a UV rays-curable-sealing agent (containing 10 μm beads) was applied to a sealing face of the concave portion of the sealing substrate and bonded to the sealing substrate and was irradiated with UV-rays having the dominant wavelength of 365 nm (100 mW/cm$^2$, 60 sec) from the side of the sealing substrate to complete a sealing process. The thickness of the organic El device thus obtained was measured by a slide caliper and determined to be 1.41~1.42 mm.

(3) Shell Life Characteristics of the Device

The device thus formed was placed in the environment of high temperature and high humidity of 85° C. and 85% to carry out an accelerated shell life test. After an elapse of 100 hours, the device was taken out and the state of the light emission of the device was observed. As a result, it was confirmed that the state of emission after an elapse of 100 hrs was almost the same as that before the test and the occurrence and growth of non-light emitting portions were suppressed and the UV rays-curable water-capturing agent of this example sufficiently functioned.

In the examples described above, the water-absorbing agent for an organic EL device comprises a water-absorbing substance, as well as, a UV rays-curing agent. Accordingly, in case of the construction where the water-absorbing agent for an organic EL device is applied directly to an organic EL device, a water-capturing layer covering the light-emitting part can be formed without damaging the organic layer by a simple process in which only irradiation with UV-rays is carried out. However, in cases where a water-capturing layer is not formed directly to the substrate, but formed to the sealing substrate, a curing agent contained in the water-absorbing agent for an organic EL device for forming the water-capturing layer is not necessarily a UV rays-curing agent, but may be a heat-curing agent including a heat-polymerization initiator. Such a heat-polymerization initiator includes organic peroxide, such as peroxyketal, hydroperoxide, dialkylperoxide, diacyllperoxide, peroxydicarbonate, peroxyester, etc.

Obviously, many modifications and variations of the present invention are possible in the light of the above teachings. It is therefore to be understood that within the scope of the appended claims, the invention may be practiced otherwise than as specifically described.

What is claimed is:

1. A water-absorbing agent for an organic EL device comprising a water-absorbing substance and an UV ray-curing agent, wherein said water-absorbing substance is an organometallic compound represented by the chemical structural formula (1);

(1)

wherein R is an alkyl group having one or more carbon atoms, M is aluminum, n is an integer of 1 and above, and wherein said UV ray-curing agent comprises a light-transmissible monomer having a lipophilic group.

2. A water-absorbing agent for an organic EL device according to claim 1, wherein said monomer is an acrylate and/or a methacrylate.

3. A water-absorbing agent for an organic EL device according to claim 2, wherein said monomer is selected from a group consisting of a monofunctional acrylate represented by the chemical structural formula (6) and a monofunctional methacrylate represented by the chemical structural formula (7);

(6)

-continued (7)

wherein R is an alkyl group, an aryl group, a cycloalkyl group, a heterocyclic group or an acyl group having one or more carbon atoms.

4. A water-absorbing agent for an organic EL device according to claim 3, wherein said lipophilic group is a saturated hydrocarbon group having two or more carbon atoms in R.

5. A water-absorbing agent for an organic EL device according to claim 4, wherein said monomer is selected from a group consisting of a substance illustrated by the chemical structural formula (8) and a substance represented by the chemical structural formula (9)

(8)

(9)

6. A water-absorbing agent for an organic EL device according to claim 2, wherein said monomer is a bifunctional acrylate and/or bifunctional methacrylate.

7. A water-absorbing agent for an organic EL device according to claim 6, wherein said lipophilic group is a saturated hydrocarbon group having two and above of carbon atoms.

8. A water-absorbing agent for an organic EL device according to claim 7, wherein said monomer is selected from a group consisting of a substance illustrated by the chemical structural formula (10) and a substance illustrated by the chemical structural formula (11)

(10)

(11)

9. A water-absorbing agent for an organic EL device according to claim 2, wherein said monomer is a polyfunctional acrylate exceeding trifunctional acrylate and/or a polyfunctional methacrylate exceeding trifunctional methacrylate.

10. A water-absorbing agent for an organic EL device according to claim 9, wherein said lipophilic group is a saturated hydrocarbon group having two and above of carbon atoms.

11. A water-absorbing agent for an organic EL device according to claim 10, wherein said monomer is selected from a group consisting of a substance illustrated by the chemical structural formula (12) and a substance illustrated by the chemical structural formula (13)

12. An organic EL device comprising a light-emitting part having a cathode, an organic layer and an anode placed between a first substrate and a second substrate, at least one of the substrates being light-transmissible for permitting light of the organic layer to take out of at least one of the anode and the cathode, wherein the water-absorbing agent of claim 1 is placed between the first substrate and the second substrate.

13. An organic EL device according to claim 12, wherein said light-emitting part is formed as a laminate on an inner surface of said first substrate and said water-absorbing agent is charged into a space between the inner surface of said first substrate and said light-emitting part and the inner surface of said second substrate.

14. An organic EL device according to claim 13, wherein a water barrier film is placed between said light-emitting part and said water-absorbing agent.

15. An organic EL device according to claim 14, wherein said water barrier film comprises a substance selected from the group consisting of SiOx wherein x is $0<x\leqq 2$, SiN and mixtures thereof.

16. An organic EL device according to claim 13, wherein an ultraviolet-curable sealing agent is applied to an outer peripheral portion of said water-absorbing agent and at least one outer peripheral portion of said first substrate and said second substrate and cured.

17. An organic EL device according to claim 12, wherein said light-emitting part is formed as a laminate on an inner surface of said first substrate, a concavity is formed in the inner surface of said second substrate and said water-absorbing substance for the organic EL device is placed in said concavity to be fixed.

* * * * *

UNITED STATES PATENT AND TRADEMARK OFFICE
CERTIFICATE OF CORRECTION

PATENT NO. : 7,622,199 B2
APPLICATION NO. : 11/100936
DATED : November 24, 2009
INVENTOR(S) : Tanaka et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1055 days.

Signed and Sealed this

Fourteenth Day of December, 2010

David J. Kappos
*Director of the United States Patent and Trademark Office*